United States Patent [19]
Laborie

[11] Patent Number: 5,006,666
[45] Date of Patent: Apr. 9, 1991

[54] ELECTROMAGNETIC SHIELDING GASKET

[75] Inventor: Claude F. Laborie, Perrosson, France

[73] Assignee: Rollin S. A., France

[21] Appl. No.: 506,963

[22] Filed: Apr. 6, 1990

Related U.S. Application Data

[62] Division of Ser. No. 295,702, Jan. 10, 1989, Pat. No. 4,966,637.

[30] Foreign Application Priority Data

Jan. 13, 1988 [FR] France ................. 88 00320

[51] Int. Cl.$^5$ ............................... H05K 9/00
[52] U.S. Cl. ........................ 174/35 GC; 174/34 MS
[58] Field of Search ............ 277/228, 229, 230, 901; 87/6, 7; 174/35 GC, 35 R, 35 MS

[56]         References Cited
U.S. PATENT DOCUMENTS 3,312,769  4/1967  La Kaff ................. 174/35 GC
4,037,009  7/1977  Severinsen .
4,065,138 12/1977  Severinsen .
4,515,850  5/1985  Ishino et al. .
4,520,562  6/1985  Ryoichi Sado et al. .

FOREIGN PATENT DOCUMENTS 0159733 10/1985  European Pat. Off. .
 936639 12/1955  Fed. Rep. of Germany .
2308030 11/1976  France ................. 277/901
2509949  7/1981  France .
1275379 10/1970  United Kingdom .

Primary Examiner—Leo P. Picard
Assistant Examiner—Bot Lee Ledynh
Attorney, Agent, or Firm—John Dana Hubbard; William L. Baker

[57]        ABSTRACT

The present invention relates to gasket for electromagnetic shielding. The gasket is formed of an elastomeric core and one or more bands of electrically conductive textile material which surrounds and is partially embedded in the core.

8 Claims, 2 Drawing Sheets

ELECTROMAGNETIC SHIELDING GASKET

This is a division of application Ser. No. 07/295,702, filed Jan. 10, 1989, now U.S. Pat. No. 4,966,637.

The present invention relates a method for manufacturing an electromagnetic shielding gasket.

It also relates to an automatic machine for carrying out this method, as well as a gasket obtained by this method and/or this machine.

BACKGROUND OF THE INVENTION

Various kinds of electromagnetic gaskets have already been proposed which are useful for ensuring the electric continuity of assembled parts and therefore for creating a barrier against electromagnetic radiation.

Thus, there has been proposed gaskets obtained by moulding or extrusion and made of conductive elastomeric materials which form an electromagnetic shield as well as providing an environmental shield when the gasket is interposed between two parts. However, the manufacture of these gaskets is still very costly.

Gaskets are also made from electrically conductive wire mesh which form a gasket of interlocked wires. Such gaskets do not have a satisfactory resiliency, can be crushed easily and take a permanent compression set so that the electromagnetic energy can pass through the gasket.

Electromagnetic shielding gaskets are also formed of a core of an elastomeric material and of a wire sleeve knitted over the core. Consequently the sleeve and the core of the gasket form a loose assembly the control and the handling of which are therefore not easy. Additionally, it requires that the process of core vulcanization and the process of knitting the wire sleeve around this core be done consecutively, which is a long and costly procedure.

Further, it has been known to flatten a knitted mesh, wrap it around a core and clench it along one side of the core rather than knitting the mesh over the core. The retention of the mesh around the core is generally poor and the process requires several consecutive, separate steps; forming and vulcanizing the core, knitting the mesh, flattening the mesh and wrapping it around the core.

SUMMARY AND OBJECTS OF THE INVENTION

The present invention has as an object to remedy the above drawbacks by providing an electromagnetic shielding gasket, the manufacture of which is cheap and which gasket possesses excellent electromagnetic shielding properties. The gasket and method of forming it enables one to rapidly adapt and mount the gasket in place resulting in a substantial decrease in mounting time and cost with respect to the known gaskets.

For this purpose, the invention has as an object a method for manufacturing an electromagnetic shielding gasket comprising a core of an elastomeric material and at least one layer of electrically conductive textile material surrounding this core, formed by the steps of forming the core, preferably by extrusion, coating the core with the aid of electrically conductive textile materials and calibrating or sizing the coated core by passing it through at least one die, which, in addition to the sizing, embeds the bands of textile material at least partially into the elastomeric material of the core.

It is therefore understood that, owing to this method, not only the process of coating the core with the aid of textile material is rapid and cheap, but also the textile material will be embedded into the elastomeric material of the core which remedies the retention drawbacks of the prior gaskets and in particular of those comprising a core over which a conductive wire sleeve is simply knitted or wrapped around.

According to another feature of the method of the invention, a heating of the coated core is effected after the sizing so as to vulcanize or set the core.

According to still another feature of this method, the coated core is shaped into a desired final shape either after the heating or after the calibration, in which case the gasket which has been shaped after the calibration can then be heated.

According to an embodiment of this invention, the extrusion, coating and calibration can be obtained by co-extruding the core and the bands of textile material.

Another object of the invention is a machine for carrying out the method complying with the above features and of the type comprising at least one means for forming an elastomeric core, preferably an extruder, and a means for feeding and coating at least one band of an electrically conductive textile material around the extruded elastomeric material, and downstream of the feeding means, at least one die for calibrating the elastomeric core-textile band assembly.

According to another feature of this machine, a heating oven is provided downstream of the calibration die.

This invention concerns also an electromagnetic shielding gasket obtained by the method and/or the machine complying with the above objects, this gasket comprising at least one layer of an electrically conductive textile material incorporated at its core-contacting part into the elastomeric material of the core.

The core can be made of any appropriate solid or foamed elastomeric material, whereas the layer of electrically conductive textile material is formed of bands, the fibers of which are formed in a tight or loose manner, such as woven, knit or non woven conductive mesh or textile.

Other features and advantages of the invention will appear more clearly as the following detailed description proceeds with reference to the appended drawing, given by way of example only.

IN THE DRAWINGS

DETAILED DESCRIPTION OF THE INVENTION

Figure 1:
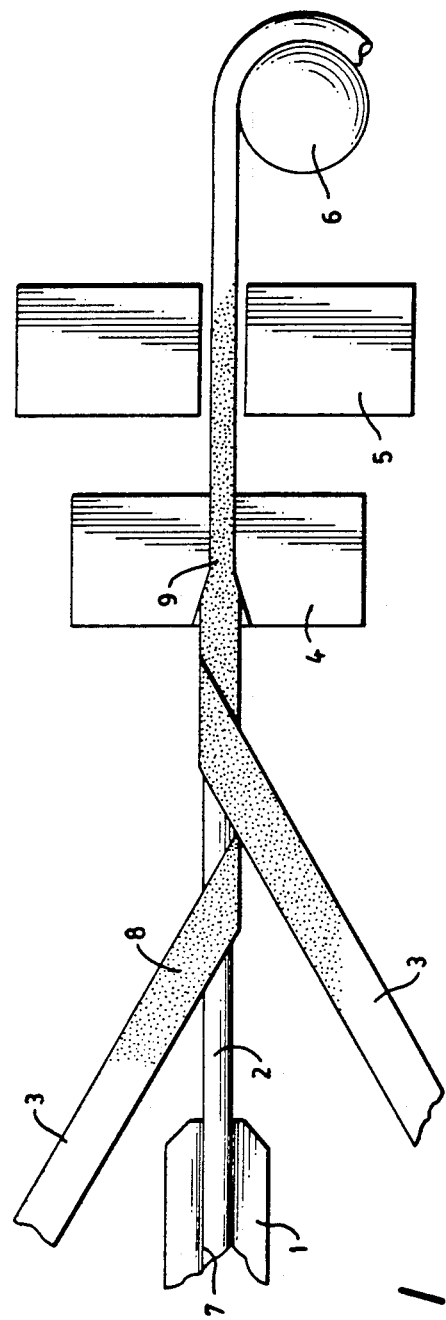
FIG. 1 is a very diagrammatic view of a machine permitting automatically manufacturing in a continuous manner a shielding gasket according to this invention.

According to the preferred embodiment shown in FIG. 1, a machine according to the principles of the invention comprises a forming means 1 for creating an elastomeric core 2 of the gasket, a means (not shown) for winding one or several bands 3 of an electrically conductive textile material about the core 2, a die means 4 for calibrating or sizing the core 2 - band 3 assembly, an oven 5 and a bobbin 6 for winding up and storing the gasket just manufactured.

Figure 3:
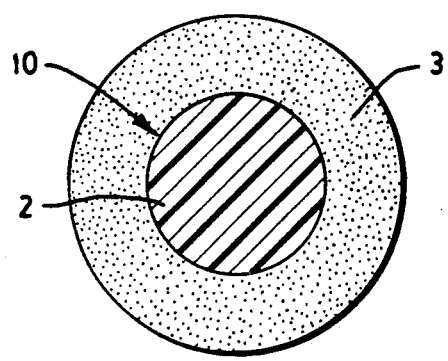
FIGS. 3 and 4 are cross-sectional views of a gasket according to this invention with a circular and rectangular cross-section respectively.
Figure 4:
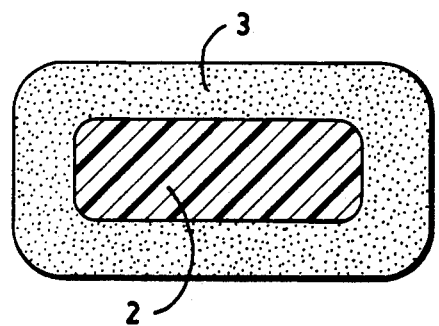

The forming means 1 preferably comprises an extruder opening 7 with any cross-section desired for obtaining a core 2 of the selected cross section, such as a circular, rectangular or polygonal in cross-section, as seen in FIGS. 3 and 4.

The extruded core 2 can be made of any appropriate elastomeric material such as for example polychloroprene, silicone and fluorosilicone rubbers, polyurethane, fluorinated elastomers, epichlorohydrin, thermoplastics and thermostable elastomers such as polyvinyl chloride, polyamides or polypropylene, or the well known elastomers or any combination of these materials depending on the intended applications of the gasket.

In addition, the elastomeric core 2 can be foamed or unfoamed, and/or solid or hollow so as to vary the compression/deflection characteristics of the gasket depending on the intended application.

The bands 3 for coating the core 2 are formed of electrically conductive threads or fibers 8 which can be interlocked, for example by weaving, knitting, braiding, bonding or other well known means. The threads may be formed in a tight or more or less loose manner.

These conductive threads or fibers can, for example, be made of nickel, stainless steel, copper, aluminum, coated steel, as well as other well known conductive materials. Once the core 2 is wrapped by the bands 3, the assembly passes through the opening 9 of the sizing die 4, as clearly seen in FIG. 1, which not only calibrates this assembly to the proper diameter, but also incorporates at least a portion of the bands 3 into the elastomeric material of core 2, as seen at 10 in FIGS. 3 and 4.

More Precisely, in the area shown at 10, it is seen that the parts of bands 3, which are in contact with core 2 and the elastomeric material forming this core, interpenetrate each other, so that as the assembly leaves the die 4 it forms an integral, homogeneous, flexible element which presents all the required qualities of electromagnetic shielding gaskets.

Although not compulsory, this element or gasket can be heated in a continuous manner, in the housing or oven 5 before being wound up on bobbin 6. The coated core can then be shaped into an appropriately shaped gasket. The gasket may not need to be heated after sizing, depending upon the material used for the core and its end use. Further, if one desires, one may take an unheated gasket, form it to a specific, desired shape and then heat the core to cause the gasket to retain the desired shape.

Figure 2:
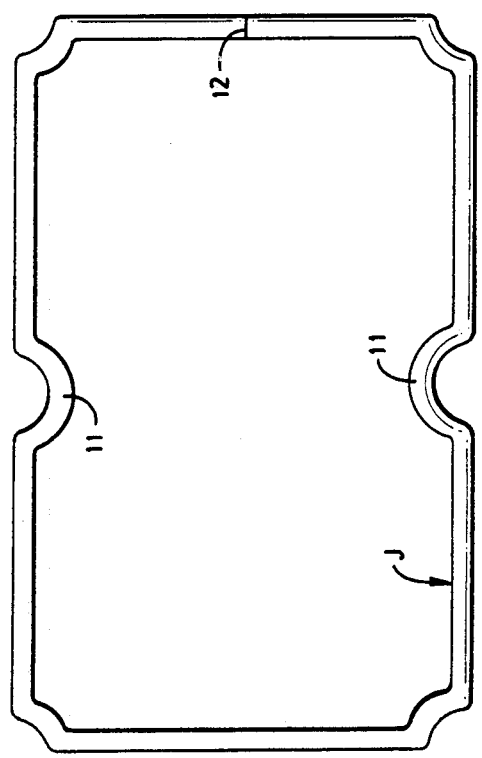
FIG. 2 is a plane view of an example of gasket formed with the aid of the gasket manufactured by the machine of FIG. 1 and shaped with the aid of appropriate tools.

An example of a shape for the gasket J is shown in FIG. 2. The gasket can be used for ensuring the electromagnetic shielding between a housing and its lid. This gasket J comprises curvated portions 11 in order to avoid having the screws for fastening the lid to the housing pass through the gasket, and at 12 are shown the end-to-end joined and possibly welded ends of J made with the aid of appropriate tools, which are well known in the gasket art.

As previously explained, the shielding gasket according to this invention can have any appropriate shape such as a circular or polygonal shape in cross-section (see FIGS. 3 and 4), depending on the intended uses of said gasket.

Therefore, according to the invention, an electromagnetic shielding gasket has been obtained which can be manufactured in a continuous manner, which is very advantageous concerning the cost of manufacture, shaping, and mounting time, and which presents remarkable performances due in particular to the fact that the electrically conductive textile is bonded with the core of the gasket and that the gasket has been properly sized.

Besides, such a gasket presents a good compression/deflection characteristics, as well as a very satisfactory behavior and resiliency in the presence of mechanical vibrations, which was not the case with the previously known shielding gaskets.

Of course, the invention is by no means limited to the embodiment described and illustrated which has been given by way of example only.

Thus, the extrusion, the coating of the core and the calibration could be obtained by co-extrusion of the core and of the bands instead of carrying out successively these three processes as previously explained.

While this invention has been disclosed with reference to a preferred embodiment, other embodiments can achieve the same result. Variations and modifications of the present invention will be obvious to those skilled in the art and it is intended to cover in the appended claims all such modifications and equivalents as fall within the true spirit and scope of this invention.

What I claim is:

1. An electromagnetic shielding gasket consisting of a core of an elastomeric material coated by at least one layer of an electrically conductive textile material, such that the layer of electrically conductive textile material is at least partially incorporated into the elastomeric material of the core.

2. The gasket according to claim 1, wherein the core is selected from the group consisting of solid and foamed elastomeric material, and the layer of textile material is formed of bands, the fibers of which are interlocked.

3. An electromagnetic shielding gasket consisting of a core of an elastomeric material having at least one layer of electrically conductive textile material wound about and partially incorporated into the core.

4. The gasket of claim 3 wherein the core is an elastomeric material selected from the group consisting of polychloroprene, silicone and fluoro-silicone rubbers, polyurethane, fluorinated elastomers, epichlorohydrin, thermoplastics and thermostable elastomers and combinations thereof; the textile material is formed of a material selected from the group consisting of nickel, stainless steel, copper, aluminum and coated steel.

5. An electromagnetic shielding gasket consisting of a core of elastomeric material, and an outer covering of electrically conductive bands wherein a portion of the electrically conductive bands and the elastomeric material interpenetrate each other so as to form an integral, flexible gasket.

6. The gasket of claim 5 wherein the core is an elastomeric material selected from the group consisting of polychloroprene, silicone and fluoro-silicone rubbers, polyurethane, fluorinated elastomers, epichlorohydrin, thermoplastics and thermostable elastomers and combinations thereof; the core is selected from the group consisting of solid and foamed elastomeric materials; the electrically conductive bands are formed of threads or fibers which have been interlocked by a means selected from the group consisting of weaving, knitting, braiding and bonding; and the fibers are selected from the group consisting of nickel, stainless steel, copper, aluminum, and coated steel.

7. An electromagnetic shielding gasket made by the process consisting of forming a core of an elastomeric material, coating the core with at least one electrically conductive band of a conductive textile material so as to surround the core with the band and form a coated core and calibrating the coated core by passing it through at least one die which also causes the band of textile material to be partially incorporated into the elastomeric material of the core.

8. The gasket made by the process of claim 7 wherein the core is formed of an elastomeric material selected from the group consisting of polychloroprene, silicone and fluoro-silicone rubbers, polyurethane, fluorinated elastomers, epichlorohydrin, thermoplastics and thermostable elastomers and combinations thereof; the textile material is formed by weaving and comprised of a conductive material selected from the group consisting of nickel, stainless steel, copper, aluminum, and coated steel.

* * * * *